US012494393B2

(12) United States Patent
Kathavarayan

(10) Patent No.: US 12,494,393 B2
(45) Date of Patent: Dec. 9, 2025

(54) FACEPLATE LOADING PLATFORM

(71) Applicant: Applied Materials, Inc., Santa Clara, CA (US)

(72) Inventor: Thyagarajan Kathavarayan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 168 days.

(21) Appl. No.: 18/185,900

(22) Filed: Mar. 17, 2023

(65) Prior Publication Data

US 2024/0312815 A1 Sep. 19, 2024

(51) Int. Cl.
*H01L 21/673* (2006.01)
*B23Q 3/18* (2006.01)
*H01J 37/32* (2006.01)

(52) U.S. Cl.
CPC .......... *H01L 21/67333* (2013.01); *B23Q 3/18* (2013.01); *H01J 37/32009* (2013.01); *H01L 2221/683* (2013.01)

(58) Field of Classification Search
CPC ........... H01L 21/67333; H01L 21/6719; H01L 21/67742; H01L 21/67748
See application file for complete search history.

(56) References Cited

U.S. PATENT DOCUMENTS

2004/0151570 A1    8/2004  Tanaka
2005/0105991 A1*   5/2005  Hofmeister ....... H01L 21/67724
                                                             414/217
2011/0262252 A1   10/2011  Lee et al.
2022/0384240 A1   12/2022  Lee et al.

FOREIGN PATENT DOCUMENTS

KR    20070054960 A   *   5/2007

OTHER PUBLICATIONS

Application No. PCT/US2024/018122, International Search Report and Written Opinion, Mailed on Jun. 13, 2024, 11 pages.

* cited by examiner

*Primary Examiner* — Jason L Vaughan
*Assistant Examiner* — Amanda Kreiling
(74) *Attorney, Agent, or Firm* — Kilpatrick Townsend & Stockton LLP

(57) ABSTRACT

Exemplary semiconductor component assembly platforms include a base frame having a frame body extending from a first end to a second end. The component assembly platforms include a telescoping frame movably connected to the base frame and a component support movably connected to the telescoping frame. Semiconductor component assembly platforms exhibit a compressed position and a fully extended position. In a compressed position, a first end of the telescoping frame is disposed substantially above a first end of the base frame. In an extended position, the first end of the telescoping frame is disposed between the first end and the second end of the base frame, and a second end of the component support is disposed outward of the second end of the telescoping frame. The component assembly platform may be characterized by having a fully extended length that is at least about 1.2 times greater than the compressed length.

19 Claims, 8 Drawing Sheets

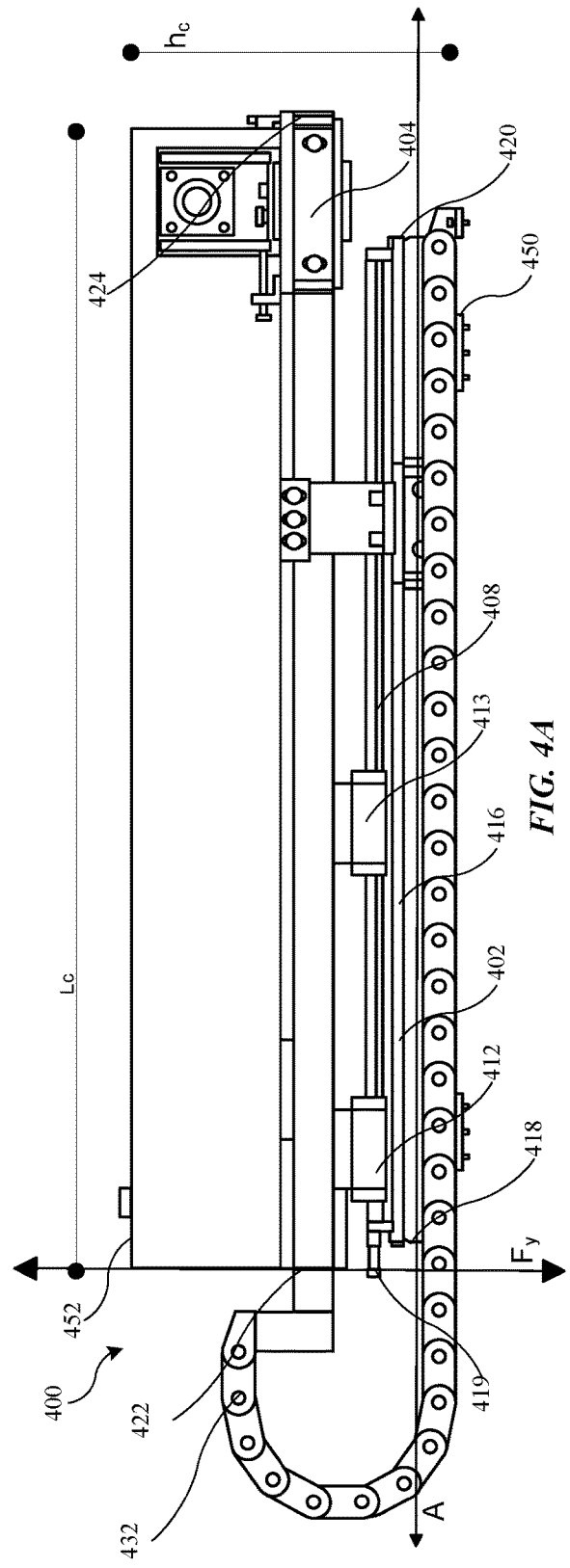

FACEPLATE LOADING PLATFORM

TECHNICAL FIELD

The present technology relates to components and apparatuses for semiconductor manufacturing. More specifically, the present technology relates to the assembly of processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, chamber components have been introduced that may include regular patterns of features, such as apertures, for providing materials in a way that may increase uniformity. In order to clean deposits formed within the apertures and over the component body, such chamber components require regular removal from the chamber. However, removal of chamber components has become increasingly difficult due to the complexity and size of the chambers as well as the increasing weight and complexity of the components.

Thus, there is a need for improved platforms and methods that can be used to assemble chambers containing such components as well as facilitate the removal of chamber components therefrom. These and other needs are addressed by the present technology.

SUMMARY

Exemplary semiconductor component assembly platforms may include a base frame having a frame body extending from a first end to a second end. The component assembly platforms may include a telescoping frame movably connected to the base frame. The component assembly platforms may include a component support movably connected to the telescoping frame. Semiconductor component assembly platforms may be characterized by having a compressed position and a fully extended position. Platforms have a compressed position and a fully extended position, wherein a second end of the telescoping frame has a distance from a first end of the base frame that is greater in a fully extended position than in a compressed position The semiconductor component assembly platform may be characterized by having a compressed length and a fully extended length. A compressed length may extend from the first end of the base frame to the second end of the telescoping frame. A fully extended length may extend from the first end of the base frame to the second end of the component support. The component assembly platform may be characterized by having a fully extended length that is at least about 1.2 times greater than the compressed length.

In some embodiments, the telescoping frame may have a width extending from a first side to a second side. The fully extended length of the semiconductor component assembly platform may be about 1.75 times greater or more than the telescoping frame width. The component support may have a width extending from a first side of the component support to a second side of the component support. A component support width may be less than the telescoping frame width. The component support width may be from about 50% to about 99% of the telescoping frame width. The component assembly platform may have a compressed position height extending from a bottom side of the base to a top side of component support. A fully extended position height may be defined extending from the bottom side of the base to the top side of the component support. In some embodiments, the compressed position height may be about 90% to about 100% of the fully extended position height. In embodiments, the first end of the telescoping frame may be disposed substantially above a first end of the base frame in a compressed position, and the first end of the telescoping frame is disposed between the first end and the second end of the base frame in a fully extended position. In an extended position, a second end of the component support is disposed outward of the second end of the telescoping frame, relative to the frame body.

In one embodiment, the telescoping frame, the component support, or both, may be movable in a plane generally parallel to the base frame body. The component assembly platform may define a line that extends through the first end and the second end of the base frame. The telescoping frame, the component support, or both, may be movable along, or parallel to, the defined line. The telescoping frame and the component support may also be movable in a forward and reverse direction along, or parallel to, the line. The base frame may include a first guide rail assembly disposed on a top side of the base frame. The telescoping frame may include a second guide rail assembly disposed on a top side of the telescoping frame. The telescoping frame may be movable along the first guide rail assembly and the component support may be movable along the second guide rail assembly. The component assembly platform may include a linear actuator coupled to the telescoping frame and the component support. The component assembly platform may also include a cable carrier, drag chain, energy chain, cable chain, or a combination thereof coupled to the linear actuator.

In some embodiments, the component support may include a base and an alignment rim. The base may be substantially planar, and the alignment rim may extend from a top surface of the base. The alignment rim may have a shape different than a shape of the base. The alignment rim may be defined by an interior area that is less than an area of the base. The base frame, the telescoping frame, the component support, or a combination therefore may be formed from a metal, or alloy thereof. The metal, or alloy thereof, exhibits a density of about 3,000 kg/m$^3$ or greater and/or a tensile strength of about 250 MPa or greater.

Some embodiments of the present technology may encompass methods of assembling a semiconductor processing chamber. The methods may include placing a processing chamber component on a component support of a component assembly platform in a compressed position. The component assembly platform may include a base frame having a frame body extending from a first end to a second end. The component assembly platforms may include a telescoping frame movably connected to the base frame. The component assembly platforms may include a component support movably connected to the telescoping frame. The methods may include transitioning the component assembly platform from the compressed position to a fully extended position. The methods may include positioning the processing chamber component within the processing chamber. In a compressed position, the processing chamber component may be outside of the processing chamber. In an extended position, a second end of the component support is disposed outward of the second end of the telescoping frame. In a fully extended position, the processing chamber component may be located inside of the processing chamber.

In some embodiments, the methods include where the processing chamber component may be positioned about 0.5 meters or more from the opening. The processing chamber component may have a weight of about 1 kilogram or more.

Such technology may provide numerous benefits over conventional systems and techniques. For example, embodiments of the present technology may allow loading of heavy components in complex processing chambers with little to no operator involvement. Additionally, devices and techniques discussed herein are capable of handling heavy components while having a width and height compatible with existing processing chambers. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 4A shows a side view of an exemplary loading platform according to some embodiments of the present technology.

FIG. 4B shows a side view of an exemplary loading platform in an extended position according to some embodiments of the present technology.

Figure 1:
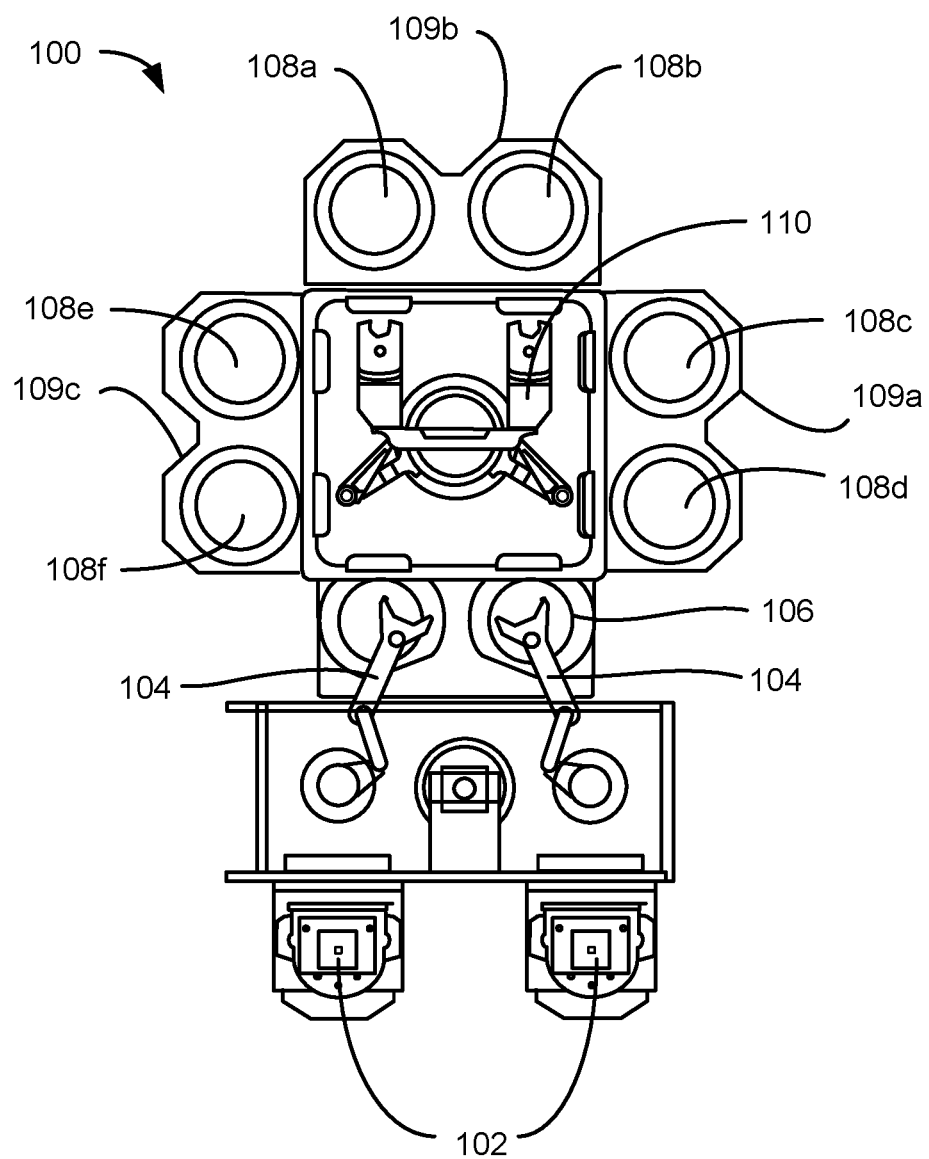
FIG. 1 shows a top plan view of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral distribution of delivery to provide increased formation or removal at the substrate surface.

For example, one or more devices may be included within a processing chamber for delivering and distributing precursors within a processing chamber. A blocker plate may be included in a chamber to provide a choke in precursor flow, which may increase residence time at the blocker plate and lateral or radial distribution of precursors. In addition, faceplates have been formed that can further improve uniformity of delivery into a processing region, for example, by containing a plurality of apertures, which may improve deposition or etching. However, even small amounts of leftover precursor or film can negatively affect further process steps, requiring regular removal of faceplates for cleaning. In addition, various substrates utilizing differing film types and patterns can require faceplates with alternative delivery profiles. These factors, among others, necessitate regular removal and replacement of faceplates and other components within processing chambers.

Processing chambers have also become more complex. Consequently, the area within the chamber to maneuver components into or out of position has become increasingly challenging to access. For example, current processing chambers include additional components that hinder access to faceplate locations. Moreover, the size of processing chambers has increased. Often, increase in size requires placement of the faceplate in areas more than a meter from the processing chamber access door. Such complex placement is compounded by the fact that components, such as faceplates, have a relatively high weight, which continues to increase as components increase in complexity.

Existing assembly processes require a human operator to manually maneuver components, such as faceplates, into position within the processing chamber. Reliance upon human operators alone is untenable due to the weight of components, small work area, and large distance from the processing chamber access door. Attempts have been made to automate the component assembly process. However, none have been able to provide a solution with a size suited for a process chamber access door that is capable of handling weights of one kilogram or more.

The present technology overcomes these challenges for the loading and removal of bulky and/or heavy components from processing chambers. By utilizing a loading platform that includes one or more telescoping segments in precise size ratios, components of all shapes and sizes can be uniformly positioned within processing chambers. Accordingly, the present technology may enable consistent and high-speed assembly and disassembly of chamber components.

Although the remaining disclosure will routinely identify specific processes chambers and components thereof utilizing the disclosed technology, it will be readily understood that the apparatus and methods are equally applicable to other deposition and cleaning chambers, components thereof, as well as processes as may occur in the described chambers. Accordingly, the technology should not be considered to be so limited as for use with these specific process chambers or components thereof alone. The disclosure will discuss one possible process chamber that may include one or more components arranged utilizing a loading platform according to embodiments of the present technology before additional variations and adjustments to this apparatus according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low-pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
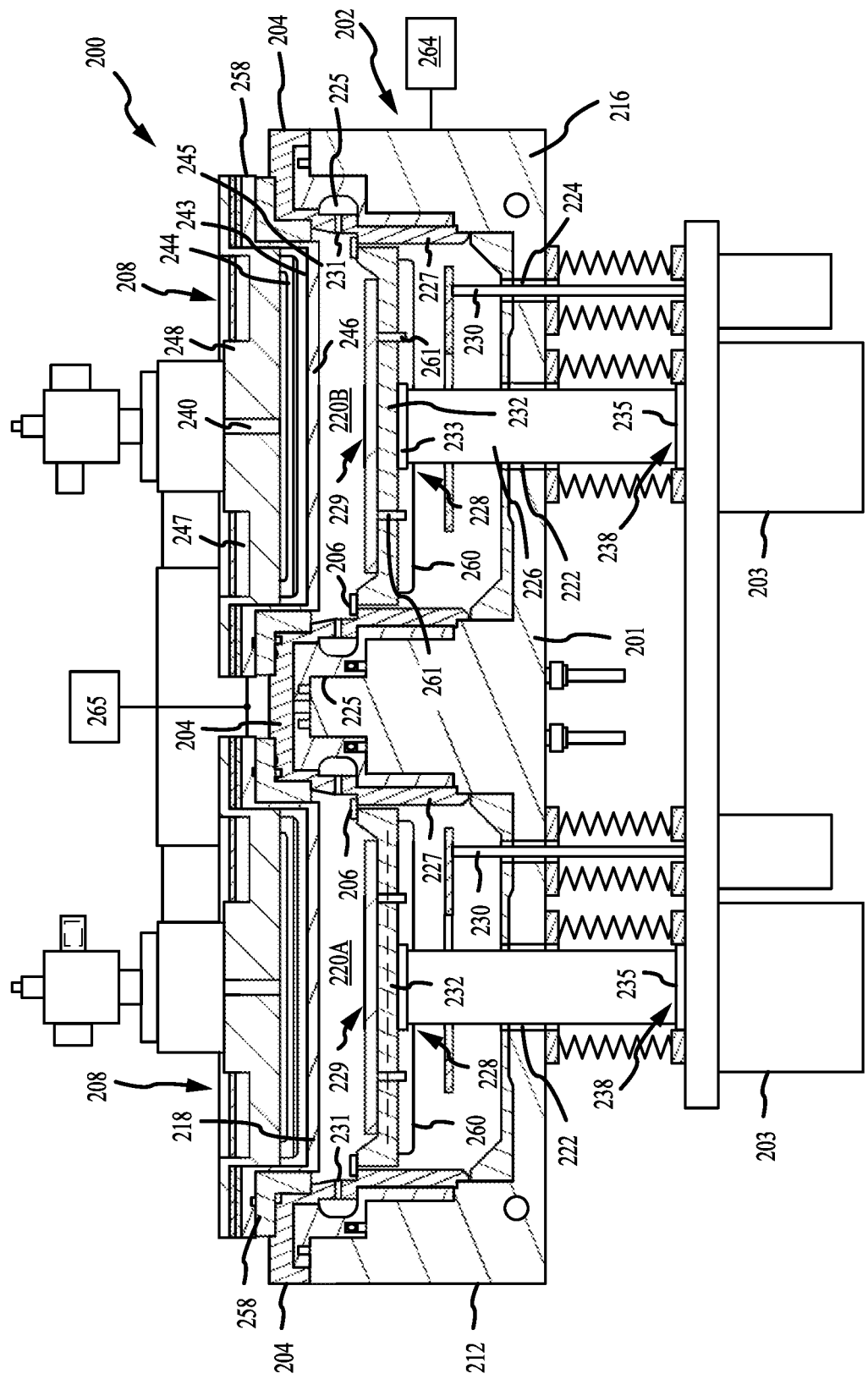
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

A faceplate 246 may be used to perform semiconductor processing operations including deposition of hardmask materials as previously described, as well as other deposition, removal, and cleaning operations. Faceplate 246 may be included in any number of processing chambers described above. Faceplate 246 may be included as part of the gas inlet assembly, such as with a gasbox and blocker plate. For example, a gasbox may define or provide access into a processing chamber. A substrate support may be included within the chamber and may be configured to support a substrate for processing. A blocker plate may be included in the chamber between the gasbox and the substrate support. The blocker plate may include or define a number of apertures through the plate. The components may include any of the features described previously for similar components, as well as a variety of other modifications similarly encompassed by the present technology.

Faceplate 246 may be positioned within the chamber between a blocker plate and a substrate support as illustrated previously. Nonetheless, faceplate 246 may be characterized by a first surface 243 and a second surface 245, which may be opposite the first surface. In some embodiments, first surface 243 may be facing towards a blocker plate, gasbox, or gas inlet into the processing chamber. Second surface 245 may be positioned to face a substrate support or substrate within a processing region of a processing chamber. Faceplate 246 may define a plurality of apertures (not shown) defined through the faceplate and extending from the first surface through the second surface. Each aperture may provide a fluid path through the faceplate, and the apertures may provide fluid access to the processing region of the chamber. Depending on the size of the faceplate, and the size of the apertures, faceplate 300 may define any number of apertures through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, or more. The apertures may have a uniform or staggered spacing and may be spaced apart at less than or about 10 mm from center to center. The apertures may also be spaced apart at less than or about 9 mm, less than or about 8 mm, less than or about 7 mm, less than or about 6 mm, less than or about 5 mm, less than or about 4 mm, less than or about 3 mm, or less.

In addition, an optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3A:
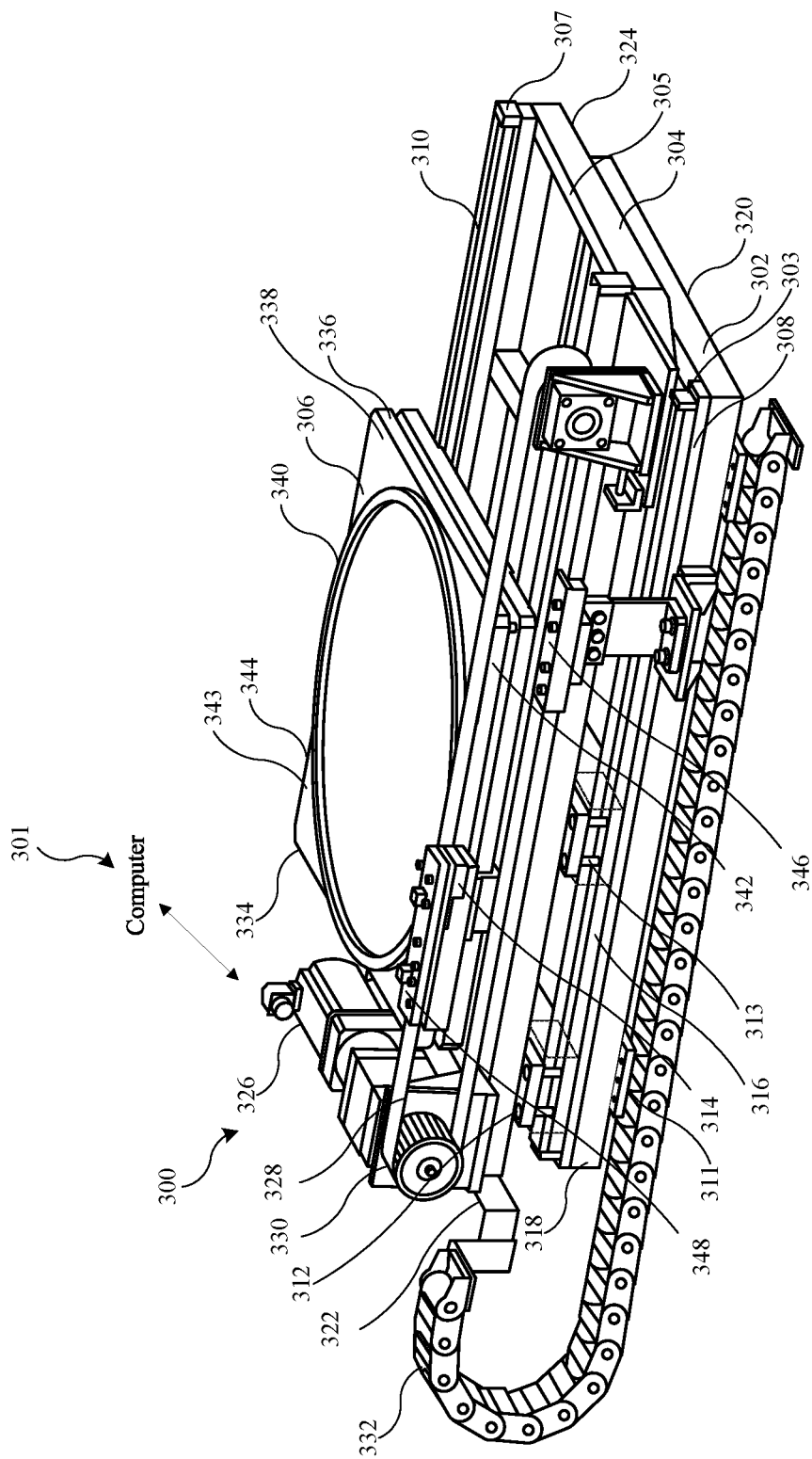
FIG. 3A shows a perspective view of an exemplary loading platform according to some embodiments of the present technology.

FIG. 3A illustrates an exemplary semiconductor component assembly platform 300 according to some embodiments of the present technology. Component assembly platform 300 contains a base frame 302, a telescoping frame 304, and a component support 306. The telescoping frame 304 is movably connected to base frame 302, and component support 306 is movably connected to telescoping frame 304. In the illustrated embodiment, the movable connection between base frame 302, telescoping frame 304, and component support 306 is a first guide rail assembly 308 disposed on a top surface 303 of base frame 302 and second guide rail assembly 310 disposed on top surface 305 of telescoping frame 304. However, it should be acknowledged that other linear guide assemblies, including ball screws, bearings, slides, supports, and the like, may be used instead of, or in addition to, the illustrated guide rail. Nonetheless, as illustrated, the telescoping frame 304 includes first linear guide couplings 312 and second linear guide couplings 313 and component support 306 includes third linear guide couplings 314. In embodiments, linear guide couplings 312, 313, and 314 may each be a bracket attaching the telescoping frame to the base frame, or component support to telescoping frame, respectively. Namely, in embodiments, one or more couplings 312, 313, 314 may be part of a respective guide rail assembly and serve to attach the telescoping frame and/or component support to the corresponding guide rail. However, it should be understood that, in embodiments, couplings 312, 313, 314 may be alternative movable attachments, such as screws, slides, rails, or the like. Furthermore, while not shown, it should be understood that base frame 302 may be permanently or removably affixed to a surface, such as an optical table, via base frame supports 311. For instance, in embodiments, as will be discussed in greater detail below, the assembly may be removably attached to a surface with bolts, screws, or the like, after alignment with the chamber in order to provide further support.

Base frame 302 includes a frame body 316 (shown more clearly in FIG. 3B), that extends from a first end 318 of the frame body 316 to a second end 320 of the frame body 316. The base frame 302, as well as telescoping frame 304 and/or component support 306, may be formed from a material having a strength and/or weight sufficient to provide support and/or counterbalance to heavy components. In one aspect, the base frame 302, telescoping frame 304, and/or component support 306 may be formed from a metal or an alloy thereof. The metal or alloy thereof may have a density of about 3,000 kg/m$^3$ or greater, such as about 3,500 kg/m$^3$ or greater, such as about 4,000 kg/m$^3$ or greater, such as about 4,500 kg/m$^3$ or greater, such as about 5,000 kg/m$^3$ or greater, such as about 5,500 kg/m$^3$ or greater, such as about 6,000 kg/m$^3$ or greater, such as about 6,500 kg/m$^3$ or greater, such as about 7,000 kg/m$^3$ or greater, such as about 7,500 kg/m$^3$ or greater, or any ranges or values therebetween. Additionally or alternatively, the metal or alloy thereof may have a tensile strength of about 250 MPa or greater, such as about 300 MPa or greater, such as about 350 MPa or greater, such as about 400 MPa or greater, such as about 450 MPa or greater, such as about 500 MPa or greater, such as about 550 MPa or greater, such as about 575 MPa or greater, such as about 600 MPa or greater, or any ranges or values therebetween. The selected metal may be in any form, such as plates, bars, rods, or other forms suitable in the art. However, due to the strength and/or weight characteristics, the selected metal may be in the form of hollow tubing. In some embodiments, the base frame 302, telescoping frame 304, and/or component support 306 may be formed from stainless steel, such as hollow stainless-steel tubing.

Referring again to FIG. 3A, the telescoping frame 304 is shown in a compressed position. In a compressed position, a first end 322 of the telescoping frame 304 is disposed substantially above the first end 318 of the base frame in a vertical direction. For instance, as illustrated in FIG. 3A (and more clearly in FIG. 4A), the first end 322 of the telescoping frame 304 may actually overhang the first end 318 of the base frame 302. In embodiments, as may be shown more clearly in FIG. 4A, the first end 318 of base frame 302 and first end 322 of telescoping frame 304 may be generally co-planar with a vertical axis extending vertically along first end 322 (e.g. along a y-axis), such as illustrated by axis $F_y$ illustrated in FIG. 4A. Nonetheless, in embodiments, first end 318 may be within about 5 inches or less of a vertical axis formed by a first end 322 (such as $F_y$), such as less than or about 4 inches, such as less than or about 3 inches, such as less than or about 2 inches, such as less than or about 1.5 inches, such as less than or about 1 inch, such as less than or about 0.5 inches, or any ranges or values therebetween. However, first linear guide couplings 312 may be disposed at or adjacent to first end 318, such as adjacent to stop 319 (illustrated in FIG. 3B) mounted on base frame 302. Second linear guide coupling 313 may instead be located approximately at a midpoint between the first end 318 and second end 320 of the base frame 302. In addition, a second end 324 of the telescoping frame may be disposed above and horizontally outward of the frame body 316 and second end 320 (illustrated more clearly in FIG. 4A), relative to frame body 316. Of course, it should be acknowledged that the telescoping frame 304 second end 324 may be disposed generally above the second end 320 of the base frame 302. However, in some embodiments, disposing a second end 324 of the telescoping frame 304 outward of second end 320 of the base frame body 316 in a compressed position may allow the assembly further reach without sacrificing strength and counterbalance.

Component support 306 includes a first end 334 and a second end 336. In the compressed position, the first end 334 of the component support is disposed above and adjacent to the first end 322 of the telescoping frame 304. In addition, in the compressed position, the second end 336 of the component support 306 is disposed between the first end 322 and the second end 324 of the telescoping frame 304. The component support includes a base 338 and an alignment rim 340.

In embodiments, the second end 324 of telescoping frame 304 may support one or more optical sensors and/or cameras 307 to aid in alignment of the assembly platform with a processing chamber. However, in embodiments, the optical sensors may be disposed on or adjacent to a second end 320 of the base frame, or a second end 336 of the component support.

In some embodiments, the base 338 is substantially planar, and may have very little variation across the base 338 in order to provide a stable surface for support large and/or heavy components. As illustrated, base 338 may include two plates firmly affixed together, such as using one or more fasteners, including bolts, screws, or the like, in order to provide further support and stability. However, it should be understood that base 338 may be formed from a single plate having a larger thickness than either plate shown, or may be formed from one or more plates having a smaller thickness based upon the weight and/or tensile strength of the material selected. Notwithstanding the material selected, base 338 is illustrated as having a square or rectangular shape. However, it should be understood that base 338 may have any shape, such as quadrilateral, (including square and/or rectangular), triangular, oval, star, or the like. In one or more embodiments, the base 338 may have a shape that does not correspond to a shape of the component desired to be assembled in the processing chamber. Instead, the shape of base 338 may be selected to provide support outside of the selected component. Base 338 may also define an area (shown more clearly in FIG. 5), from the first end 334 to the second end 336 and from the first side 342 to second 344, including the area underneath alignment rim 340.

Alignment rim 340 may be formed as part of base 338 that extends from a top surface 343 of the base. Alternatively, alignment rim 340 may be a separate piece firmly affixed to the base 338, such as by one or more fasteners, welding, or otherwise. Nonetheless, it should be clear that the alignment rim 340 may also be formed from any one or more of the metals discussed above. Alignment rim 340 is illustrated as having a circular shape. However, it should be understood that alignment rim 340 may have any shape, such as quadrilateral, (including square and/or rectangular), triangular, oval, star, or the like. In one or more embodiments, the alignment rim 340 may have a shape that corresponds to the shape of the component desired to be assembled in the processing chamber. Namely, alignment rim 340, may provide a bounded area that contains a component during transition from a compressed to fully extended position such that the component does not slip from the component support, while maintaining the added support from base 338. For example, the alignment rim 340 may have an inner diameter that is less than about 5% larger than a diameter of the component, less than 3% larger than the diameter of the component, less than 1% larger than the diameter of the component, or less to enable the component to be received within the alignment rim 340 without enabling a position of the component to change substantially during movement of the component support 306. Alignment rim 340 may also define an area (shown more clearly in FIG. 5) with the area bounded by the alignment rim 340. In some embodiments, the area defined by the alignment rim is less than the area defined by the base.

As illustrated in FIG. 3A, telescoping frame 304 may also include one or more linear actuators mounted thereon for moving telescoping frame 304 and component support 306 in a linear, telescoping manner relative to the base. For instance, as illustrated from FIG. 3A to FIG. 3B, the component support 306 and telescoping frame 304 move linearly relative to base 302 until one or more of telescoping frame 304 and component support overhang a second end 320 of base 304. Namely, as illustrated, telescoping frame 304 includes a linear actuator 326 mounted thereon. Examples of suitable linear actuators 326 include stepper motors, pneumatic motors, servo motors, rack and pinion assemblies, and combinations thereof. Nonetheless, the linear actuator 326 is coupled to a timing belt 328 via driven pulley 330. For instance, as illustrated, in embodiments, engagement of teeth on driven pully 330 may engage belt 328 in order to push and/or pull belt 328. By pushing/pulling belt 328, telescoping frame 304 and/or component support 306 may be subsequently moved utilizing first and second motion transfer plates 346, 348. For instance, in embodiments, motion transfer plates 348, 348 may be firmly affixed to the respective telescoping frame 304 and component support 306, as well as belt 328. Thus, the location of the transfer plates 346, 348 may remain fixed relative to both the belt 328 and telescoping frame 304/component support 306, facilitating movement of the telescoping frame 304 and component support 306 when belt 328 is engaged with driven pully 330. Furthermore, power, such as electrical power, may be provided to the linear actuator via power supply 332. In one embodiment, power may be provided utilizing at least one of a cable carrier, drag chain, energy chain, cable chain, or a combination thereof coupled to the linear actuator 326. While it should be understood that the linear actuator 326 may be located at various positions on the telescoping frame 304, in the illustrated embodiment, the linear actuator 326 may be disposed on a first end 322 of the telescoping frame 304. As will be illustrated more clearly in FIG. 3B, the linear actuator 326 may provide a driving force to both the telescoping frame 304 via first motion transfer plate 346 and component support 306 via second motion transfer plate 348, either simultaneously or sequentially.

Such a driving force may transition both the telescoping frame 304 and component support 306 into an extended position.

Figure 3B:
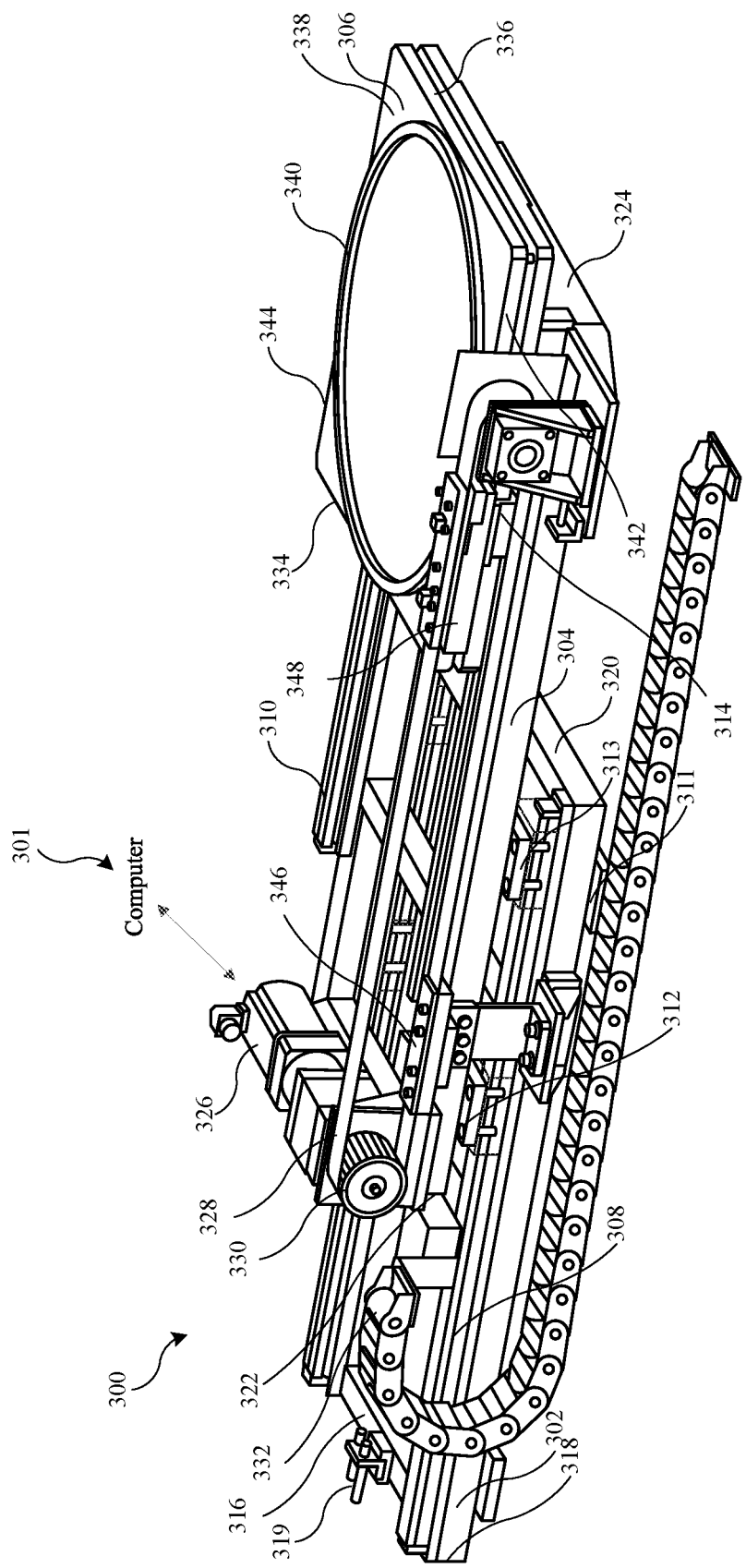
FIG. 3B shows a perspective view of an exemplary loading platform in an extended position according to some embodiments of the present technology.

For instance, FIG. 3B illustrates a semiconductor component assembly platform in a fully extended position according to embodiments of the present technology. As illustrated, the base frame 302 and energy chain 332 have remained stationary. Conversely, the telescoping frame 304 and component support 306 have moved horizontally to the right (e.g. x-direction, shown more clearly in FIG. 4B), with little to no movement in the y-direction, outward of the second end 320 of the base frame 302 relative to the frame body 316. In embodiments, second end 324 of telescoping frame 304 and/or second end 335 of component support 306 may generally extend at least about 5 inches past second end 320 of base frame 302, such as greater than or about 7.5 inches, such as greater than or about 10 inches, such as greater than or about 12.5 inches, such as greater than or about 15 inches, such as greater than or about 17.5 inches, such as greater than or about 20 inches, such as greater than or about 22.5 inches, such as greater than or about 25 inches, or any ranges or values therebetween.

For instance, the first end 322 of telescoping frame 304 is now disposed between the first end 318 and second end 320 of the base frame, while remaining vertically above base frame 302. Similarly, in the fully extended position, the second linear guide coupling 313 of the telescoping frame 304 may be disposed adjacent to the second end 320 of base frame 302. Namely, in embodiments, a second end of the component support and/or second end of the telescoping frame has a distance from a first end of the base frame that is greater in a fully extended position than in a compressed position. Thus, such an arrangement allows the second end 324 of the telescoping frame 304 to overhang or cantilever over second end 320 of the base frame while remaining horizontally stable, for instance, by generally remaining within about 20 degrees or less of an original (compressed orientation) x-direction plane, such as less than or about 15 degrees, such as less than or about 10 degrees, such as less than or about 5 degrees, or any ranges or values therebetween, even when supporting heavy and/or large components.

Moreover, in a fully extended position, second end 336 of the component support 306 overhangs or cantilevers over second end 324 of the telescoping frame 304. Namely, as illustrated, the second end 336 of the component support 306 is now located horizontally outward from the second end 324 of the telescoping frame 304 relative to frame body 316. Similarly, the first end 334 of the component support is now disposed between the first end 322 and the second end 324 of the telescoping frame 304. Thus, the assembly of the present disclosure provides a telescoping mechanism capable of travelling a large distance without requiring an expanded footprint of the base. Such an assembly is capable of performing even within small processing chamber openings and in restricted environments. Furthermore, the arrangement of the linear actuator 326, timing belt 328, timing pulley 330, and motion transfer plates 346, 348 allows this motion to occur quickly for such a large distance. For instance, the timing belt 328 may act upon motion transfer plates 346 and 348 simultaneously such that both the telescoping frame 304 and the component support 306 move in unison. Of course, it should be understood that, in some embodiments, telescoping frame 304 and component support 306 may instead move sequentially.

As illustrated in FIGS. 3A and 3B, the operation of the assembly platform 300 may be controlled by a computer system 301. The computer system 301 may include any device or combination of devices configured to implement the operations described below. Accordingly, the computer system 301 may be a controller or array of controllers and/or a general purpose computer configured with software stored on a non-transitory, computer-readable medium that, when executed, may perform the operations described in relation to methods according to embodiments of the present technology.

While the present disclosure has thus far discussed a compressed position and a fully extended position, it should be clear that, in embodiments, a partially extended position may also be utilized. For instance, the assembly of the present technology may be used in conjunction with smaller chambers, needing less extension length, but that would still benefit from assistance with heavy chamber components. Thus, in embodiments, a partially extended position may be a position between a compressed position and a fully extended position.

FIG. 4A illustrates an exemplary semiconductor component assembly platform 400 in a compressed position from a side view. For instance, component assembly platform 400 has a compressed length $L_c$ in a compressed position extending from a first end 418 of the base frame 402 to a second end 424 of the telescoping frame 404. In some embodiments, the compressed length may be from about 500 millimeters (mm) to about 1700 mm, such as from about 600 mm to about 1600 mm, such as from about 700 mm to about 1500 mm, such as from about 800 mm to about 1400 mm, such as from about 900 mm to about 1300 mm, such as from about 1000 mm to about 1200 mm, or any ranges or values therebetween.

In addition, the component assembly platform 400 has a compressed height $h_c$ that extends from a bottom side 450 of the base frame 402 to a top side 452 of the telescoping frame 404. In some embodiments, the compressed height may be from about 100 mm to about 600 mm, such as from about 150 mm to about 550 mm, such as from about 200 mm to about 500 mm, such as from about 250 mm to about 450 mm, such as from about 300 mm to about 400 mm, or any ranges or values therebetween.

Component assembly platform 400 also illustrates first linear guide couplings 412 and second linear guide couplings 413 movable attached to base frame 402 via first guide rail assembly 408. In the compressed position, first linear guide coupling 412 is disposed against, or adjacent to, first end 418 of the base frame 402. In some embodiments, the first linear guide coupling 412 may contact stop 419. Conversely, second linear guide couplings 413 are disposed between the first end 418 and second end 420 of the base frame 402.

FIG. 4B illustrates an exemplary semiconductor component assembly platform 400 in a fully expanded position from a side view. For instance, component assembly platform 400 has a fully expanded length $L_c$ in a fully expanded position extending from a first end 418 of the base frame 402 to a second end 436 of the component support 406. In some embodiments, the fully expanded length may be from about 1100 mm to about 2400 mm, such as from about 1200 mm to about 2300 mm, such as from about 1300 mm to about 2200 mm, such as from about 1400 mm to about 2100 mm, such as from about 1500 mm to about 2000 mm, such as from about 1500 mm to about 1900 mm, such as from about 1600 mm to about 1800 mm, or any ranges or values therebetween.

However, in some embodiments, the value of the fully expanded length $L_c$ and/or compressed length $L_c$ may instead be expressed as a relationship between the fully expanded length and the compressed length. As discussed above, the present technology may allow a large change in length from the compressed length to the fully expanded length. Such a relationship may allow more loading distance assistance without increasing the overall length footprint of the assembly and while maintaining the necessary strength and support. Thus, in some embodiments, the fully extended length is about 1.2 times or greater than the compressed length, such as about 1.25 times or greater, such as about 1.3 times or greater, such as about 1.35 times or greater, such as about 1.4 times or greater, such as about 1.45 times or greater, such as about 1.5 times or greater than the compressed length, or any ranges or values therebetween. Stated differently, in embodiments, the fully extended length may be about 300 mm greater than a compressed length, such as greater than or about 400 mm, such as greater than or about 500 mm, such as greater than or about 550 mm, such as greater than or about 575 mm, such as greater than or about 600 mm, such as greater than or about 615 mm, or any ranges or values therebetween.

In addition, the component assembly platform 400 has a fully expanded position height $h_c$ that extends from a bottom side 450 of the base frame 402 to a top side 452 of the telescoping frame 404. In some embodiments, the fully expanded height may be from about 100 mm to about 600 mm, such as from about 150 mm to about 550 mm, such as from about 200 mm to about 500 mm, such as from about 250 mm to about 450 mm, such as from about 300 mm to about 400 mm, or any ranges or values therebetween.

Namely, in some embodiments, the compressed height $h_c$ is about 90% to about 100% of the fully expanded height $h_c$, such as about 92% or greater, such as about 94% or greater, such as about 96% or greater, such as about 98% or greater, such as up to about 100% of a fully expanded height. In one embodiment, the compressed height $h_c$ and the fully expanded height $h_c$ are generally equal as the telescoping frame 404 and/or the component support 406 are movable in a plane generally parallel to the base frame body 416. Stated differently, base frame 402 defines a line A extend through first end 418 and second end 420. As illustrated by FIGS. 4A and 4B, the telescoping frame 404 and/or the component support 406 are movable along, or parallel to line A. Thus, the telescoping frame 404 and/or the component support 406 are movable in a generally linear direction with little to no variation in height or movement outside of horizontal direction x.

Moreover, it should be clear that the telescoping frame 404 and/or the component support 406 are movable in a forward and reverse direction. For example, the pulley 330 may be rotated in a first direction to move the telescoping frame 404 and/or the component support 406 in a forward direction and may be rotated in a second, opposite direction to move the telescoping frame 404 and/or the component support 406 in a reverse direction. While thus far only the transition from the compressed position to the fully expanded position has been discussed, it should be clear that the telescoping frame 404 and/or the component support 406 can also be transitioned in a reverse direction of any one or more of the above embodiments discussed herein.

Figure 5:
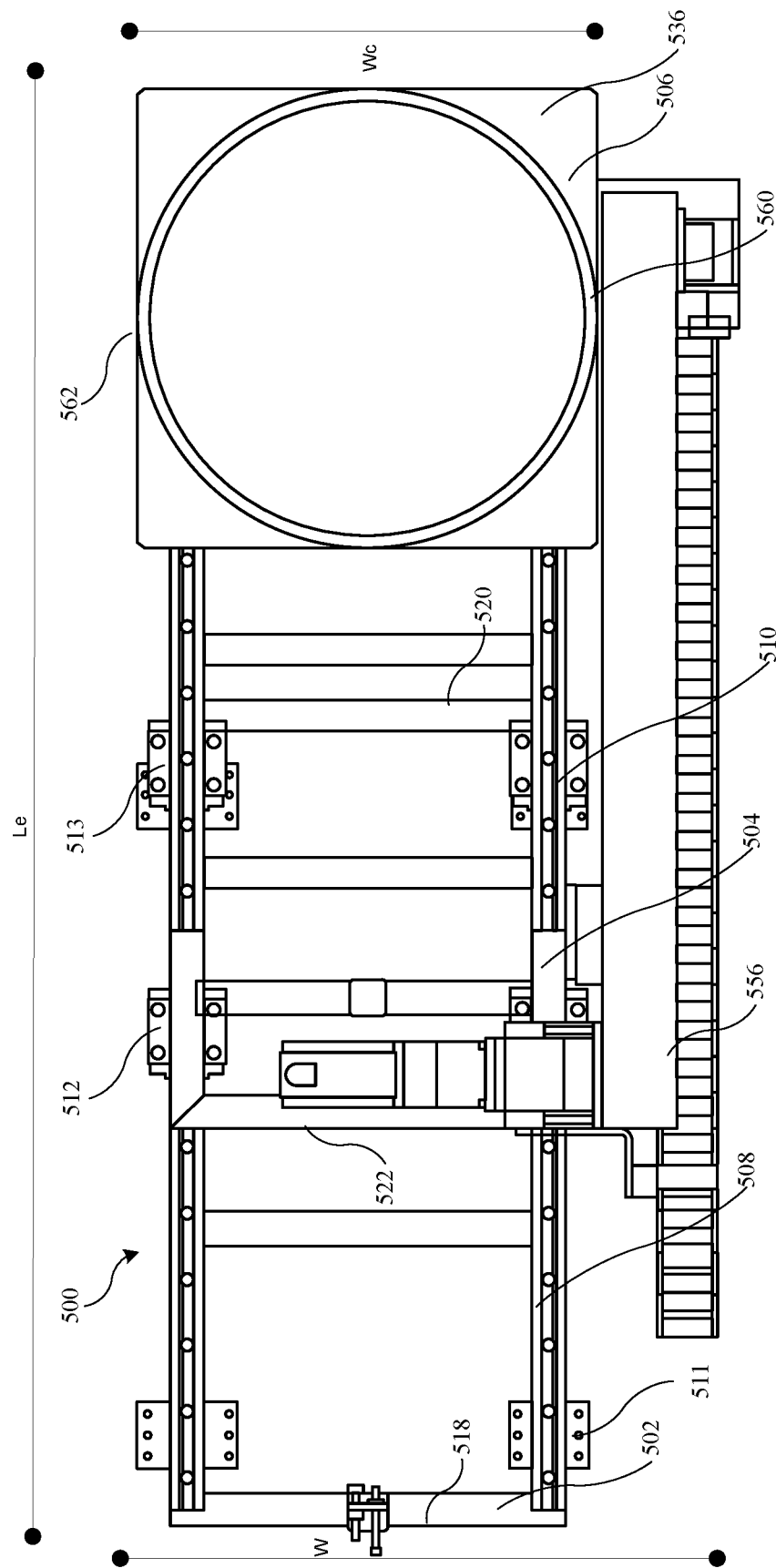
FIG. 5 shows a top plan view of an exemplary loading platform in an extended position according to some embodiments of the present technology.

FIG. 5 shows a top-down view of a component assembly platform 500 in a fully expanded position. For instance, component assembly platform 500 has a width W extending from a first side 556 of telescoping frame 504 to a second side 562 of component support 506. In some embodiments, the assembly width may be from about 200 mm to about 1200 mm, such as from about 300 mm to about 1100 mm, such as from about 400 mm to about 1000 mm, such as from about 500 mm to about 900 mm, such as from about 600 mm to about 800 mm, or any ranges or values therebetween.

Nonetheless, in one embodiment, the width W may instead be expressed in relation to the fully extended length $L_c$. Such a relationship maintains a length to width ratio suitable for supporting heavy or large components while retaining a footprint suitable for use with semiconductor processing chambers. In some embodiments, the fully extended length is about 1.75 times the telescoping frame width or greater, such as about 1.8 times or greater, such as about 1.9 times or greater, such as about 2 times or greater, such as about 2.1 times or greater, such as about 2.25 times or greater, or any ranges or values therebetween.

In addition, component support 406 has a width $W_c$ extending from a first side 560 of component support 506 to a second side 562 of component support 506. In some embodiments, the component support width may be from about 50 mm to about 1000 mm, such as from about 150 mm to about 900 mm, such as from about 250 mm to about 800 mm, such as from about 350 mm to about 700 mm, such as from about 450 mm to about 600 mm, or any ranges or values therebetween. Namely, in one embodiment, a component support width $W_c$ is less than a telescoping frame width W. For instance, in some embodiments, the component support width may be about 50% to about 99% of assembly platform 500 width W, such as about 55% or more, such as about 60% or more, such as about 65% or more, such as about 70% or more, such as about 75% or more, such as about 97.5% or less, such as about 95% or less, such as about 92.5% or less, such as about 90% or less, such as about 87.5% or less, such as about 85% or less, such as about 82.5% or less, such as about 80% or less of the component assembly platform width, or any ranges or values therebetween. When the component support 506 exhibits a width less than an assembly platform width, the component support 506 may provide further accessibility to the interior of a processing chamber while maintaining adequate support from the base frame 502 and telescoping frame 504.

Figure 6:
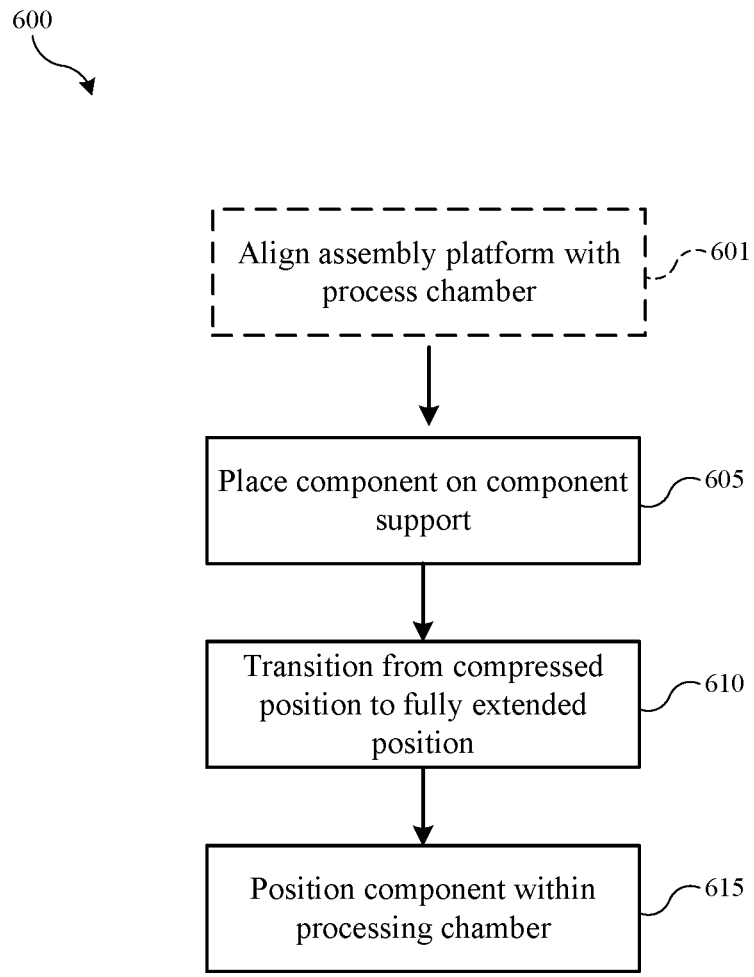
FIG. 6 shows operations of an exemplary method of semiconductor processing according to some embodiments of the present technology.

FIG. 6 shows operations of a method of assembling a semiconductor processing chamber, such as any one or more of processing chambers 108 (208) discussed above. For instance, the method 600 may include placing a component of a processing chamber onto a component support 605, where the component support may be according to any one or more of the embodiments discussed herein. In addition, the component of a processing chamber may be any one or more aspects of a gas delivery assembly, a lid assembly, or the like. For instance, in one embodiment, the component may be a gas delivery component, such as a faceplate. In some embodiments, the component may have a weight of about 1 kilogram (kg) or more, such as about 1.1 kg or more, such as about 1.2 kg or more, such as about 1.3 kg or more, such as about 1.4 kg or more, such as about 1.5 kg or more, or any ranges or values therebetween. Regardless of the component selected, it should be clear that step 605 occurs when the component assembly platform is in a compressed position.

After the component has been placed on the component support, such as within the area bounded by the rim of the component support, the assembly platform is transitioned from the compressed position to a fully extended position 610. It should be acknowledged that, in some embodiments, the transition may be automatic. Particularly, the fully extended position may be selected based upon the respective processing chamber to automatically provide a component at the desired location.

Additionally or alternatively, in embodiments, sensors, such as one or more optical sensors may be utilized to signal to the platform that the fully extended position has been reached, such as when the component platform is aligned with an installment location, stopping motion of the assembly. Namely, at an optional operation 601, which may occur before or after operation 605, in embodiments, one or more cameras and one or more optical sensors may be utilized to align the assembly platform with an opening in a process chamber. In embodiments, the optical sensors may be utilized to align the assembly platform in a horizontal plane (e.g., illustrated x-axis of FIGS. 4A and 4B) with the sidewalls of the opening, in a vertical plane (e.g., y-axis of FIGS. 4A and 4B) with a bottom and top wall of the opening, and/or a depth distance in a horizontal plane. For instance, optical sensors may be utilized to determine how closely in a horizontal plane the assembly platform should be placed in order to dispose component support at an appropriate location within the processing chamber. Additionally or alternatively, the optical sensor may be utilized to set the servo motor to a specific extension distance if a fully extended position is not necessary for embodiments. In embodiments, one or more cameras may be utilized either alone, or in addition to one or more optical sensors, to aid in the alignment of the assembly platform in any of the manners discussed in regards to optical sensors. In embodiments, the alignment, distance selection, and transitioning, such as operations 601, 605, and 610, for example, may be automatically conducted, such as utilizing one or more processors configured to execute the operations.

Once the assembly platform is in the fully extended position, the component may be assembled, or positioned, at the desired location within the processing chamber. As discussed herein, the transition to the fully extended position transports the component to a location directly above or below the desired assembly position. Thus, a user or automatic assembly mechanism may merely need to position the component a short distance from the component support, reducing, or even eliminating, the difficulties in assembling large and/or heavy components into processing chambers.

Nonetheless, as may be understood by the above disclosure, the placing step 605 occurs at a location outside of a processing chamber. Thus, the component is placed onto a component support at an exterior of a processing chamber. Conversely, step 610 transitions the component from the exterior of the processing chamber, thorough an opening in the processing chamber, and disposes the component at an interior location within the chamber at a fully extended position. In one aspect, the interior location may about 0.5 meters or more from the opening in the processing chamber, such as about 0.6 meters or more, such as about 0.7 meters or more, such as about 0.8 meters or more, such as about 0.9 meters or more, such as about 1 meter or more, or any ranges or values therebetween.

Finally, as may be clear from the above description, in some embodiments, the component support width $W_c$ is less than a processing chamber opening width (not shown). Furthermore, the assembly platform width W may also be less than a processing chamber opening width. In addition, as the assembly platform may be located at or near one or more processing chambers, such as on an optical table, in some embodiments, the assembly platform is a clean room compatible mechanism utilizing clean room compatible components and materials.

Figure 7:
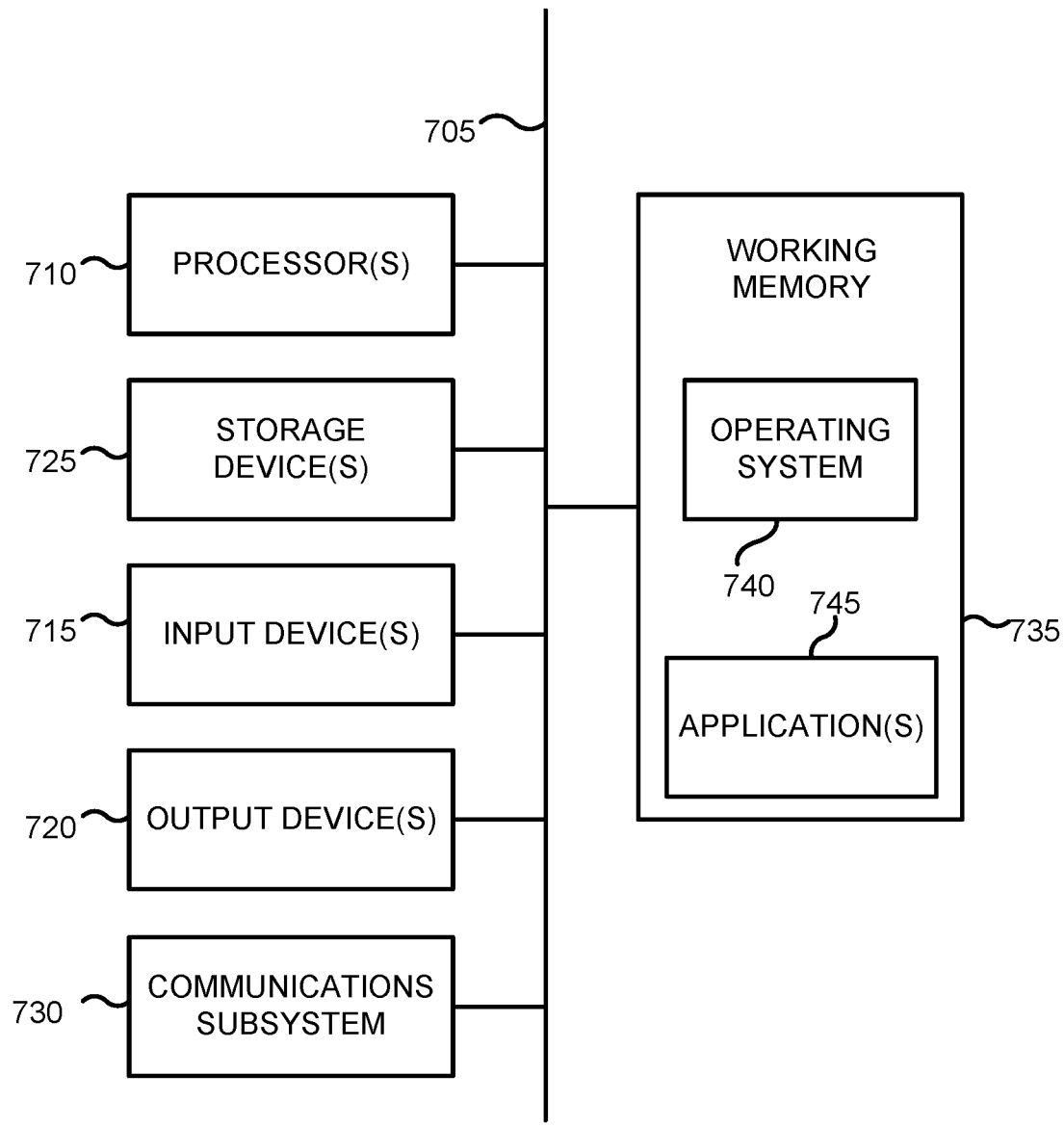
FIG. 7 illustrates a block diagram of a sample computer system that may operate embodiments of the present technology.

Nonetheless, as illustrated in FIG. 7, in embodiments, the systems and methods may be executed fully or in part by a processor which may be incorporated as part of the previously described computer system 301. For example, computer system 700 can represent some of the components of a controller or computer system described herein. FIG. 7 provides a schematic illustration of one embodiment of a computer system 700 that can perform the methods provided by various other embodiments, as described herein. FIG. 7 is meant only to provide a generalized illustration of various components, any or all of which may be utilized as appropriate. FIG. 7, therefore, broadly illustrates how individual system elements may be implemented in a relatively separated or relatively more integrated manner.

The computer system 700 is shown including hardware elements that can be electrically coupled via a bus 705 (or may otherwise be in communication, as appropriate), which may also be connected with controller 301. The hardware elements may include a processing unit 710, including without limitation one or more processors, such as one or more central processing units (CPUs), graphical processing units (GPUs), special-purpose processors (such as digital signal processing chips, graphics acceleration processors, and/or the like); one or more input devices 715, which can include without limitation a keyboard, a touchscreen, receiver, a motion sensor, a camera, a smartcard reader, a contactless media reader, and/or the like; and one or more output devices 720, which can include without limitation a display device, a speaker, a printer, a writing module, and/or the like.

The computer system 700 may further include (and/or be in communication with) one or more non-transitory storage devices 725, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 700 might also include a communication interface 730, which can include without limitation a modem, a network card (wireless or wired), an infrared communication device, a wireless communication device and/or chipset (such as a Bluetooth device, an 502.11 device, a Wi-Fi device, a WiMAX device, an NFC device, cellular communication facilities, etc.), and/or similar communication interfaces. The communication interface 730 may permit data to be exchanged with a network (such as the network described below, to name one example), other processors, and/or any other devices described herein. In many embodiments, the computer system 700 will further comprise a non-transitory working memory 735, which can include a RAM or ROM device, as described above.

The computer system 700 also can also include software elements, shown as being currently located within the working memory 735, including an operating system 740, device drivers, executable libraries, and/or other code, such as one or more application programs 745, which may include processor programs provided by various embodiments, and/or may be designed to implement methods, and/or configure systems, provided by other embodiments, as described herein. Merely by way of example, one or more procedures described with respect to the method(s) or systems discussed above might be implemented as code and/or instructions executable by a computer (and/or a processor within a computer); in an aspect, then, such special/specific purpose code and/or instructions can be used to configure and/or adapt a computing device to a special purpose computer that is configured to perform one or more operations in accordance with the described methods.

A set of these instructions and/or code might be stored on a computer-readable storage medium, such as the storage device(s) 725 described above. In some cases, the storage medium might be incorporated within a computer system, such as computer system 700. In other embodiments, the storage medium might be separate from a computer system (e.g., a removable medium, such as a compact disc), and/or provided in an installation package, such that the storage medium can be used to program, configure and/or adapt a special purpose computer with the instructions/code stored thereon. These instructions might take the form of executable code, which is executable by the computer system 700 and/or might take the form of source and/or installable code, which, upon compilation and/or installation on the computer system 700 (e.g., using any of a variety of available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Moreover, hardware and/or software components that provide certain functionality can comprise a dedicated system (having specialized components) or may be part of a more generic system. For example, a risk management engine configured to provide some or all of the features described herein relating to the risk profiling and/or distribution can comprise hardware and/or software that is specialized (e.g., an application-specific integrated circuit (ASIC), a software method, etc.) or generic (e.g., processing unit 710, applications 745, etc.) Further, connection to other computing devices such as network input/output devices may be employed.

Some embodiments may employ a computer system (such as the computer system 700) to perform methods in accordance with the disclosure. For example, some or all of the procedures of the described methods may be performed by the computer system 700 in response to processing unit 710 executing one or more sequences of one or more instructions (which might be incorporated into the operating system 740 and/or other code, such as an application program 745) contained in the working memory 735. Such instructions may be read into the working memory 735 from another computer-readable medium, such as one or more of the storage device(s) 725. Merely by way of example, execution of the sequences of instructions contained in the working memory 735 might cause the processing unit 710 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 700, various computer-readable media might be involved in providing instructions/code to processing unit 710 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 725. Volatile media include, without limitation, dynamic memory, such as the working memory 735. Transmission media include, without limitation, coaxial cables, copper wire, and fiber optics, including the wires that comprise the bus 705, as well as the various components of the communication interface 730 (and/or the media by which the communication interface 730 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a magnetic medium, optical medium, or any other physical medium with patterns of holes, a RAM, a PROM, EPROM, a FLASH-EPROM, any other memory chip or cartridge, a carrier wave as described hereinafter, or any other medium from which a computer can read instructions and/or code.

The communication interface 730 (and/or components thereof) generally will receive the signals, and the bus 705 then might carry the signals (and/or the data, instructions, etc. carried by the signals) to the working memory 735, from which the processor(s) 710 retrieves and executes the instructions. The instructions received by the working memory 735 may optionally be stored on a non-transitory storage device 725 either before or after execution by the processing unit 710 and controller 301.

In the embodiments described above, for the purposes of illustration, processes may have been described in a particular order. It should be appreciated that in alternate embodiments, the methods may be performed in a different order than that described. It should also be appreciated that the methods and/or system components described above may be performed by hardware and/or software components (including integrated circuits, processing units, and the like), or may be embodied in sequences of machine-readable, or computer-readable, instructions, which may be used to cause a machine, such as a general-purpose or special-purpose processor or logic circuits programmed with the instructions to perform the methods. These machine-readable instructions may be stored on one or more machine-readable mediums, such as CD-ROMs or other type of optical disks, floppy disks, ROMs, RAMs, EPROMs, EEPROMs, magnetic or optical cards, flash memory, or other types of machine-readable mediums suitable for storing electronic instructions. Alternatively, the methods may be performed by a combination of hardware and software.

The methods, systems, devices, graphs, and tables discussed herein are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims. Additionally, the techniques discussed herein may provide differing results with different types of context awareness classifiers.

While illustrative and presently preferred embodiments of the disclosed systems, methods, and machine-readable media have been described in detail herein, it is to be understood that the inventive concepts may be otherwise variously embodied and employed, and that the appended claims are intended to be construed to include such variations, except as limited by the prior art.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor component assembly platform comprising:
    a base frame having a frame body extending from a first end to a second end;
    a telescoping frame movably connected to the base frame; and
    a component support movably connected to the telescoping frame;
    a compressed position and a fully extended position, wherein a second end of the telescoping frame has a distance from a first end of the base frame that is greater in the fully extended position than in the compressed position; and
    wherein the semiconductor component assembly platform has a compressed length from the first end of the base frame to the second end of the telescoping frame in the compressed position, and a fully extended length from the first end of the base frame to the second end of the component support in the fully extended position, wherein the fully extended length is at least about 1.2 times greater than the compressed length;
    wherein the base frame comprises a first guide rail assembly disposed on a top surface of the base frame, and the telescoping frame comprises a second guide rail assembly disposed on a top surface of the telescoping frame, wherein the second guide rail assembly is disposed above the first guide rail assembly in the compressed position.

2. The semiconductor component assembly platform of claim 1, wherein the component assembly platform has a width extending from a first side of the telescoping frame to a second side of the component support, wherein the fully extended length of the semiconductor component assembly platform is at least about 1.75 times greater than the component assembly platform width.

3. The semiconductor component assembly platform of claim 2, wherein the component support has a width extending from a first side of the component support to the second side of the component support, wherein the component support width is less than the component assembly platform width.

4. The semiconductor component assembly platform of claim 3, wherein the component support width is from about 50% to about 99% of the component assembly platform width.

5. The semiconductor component assembly platform of claim 1, wherein the telescoping frame, the component support, or both the telescoping frame and the component support are movable in a horizontal plane generally parallel to the frame body.

6. The semiconductor component assembly platform of claim 5, wherein the semiconductor component assembly platform has a compressed position height extending from a bottom side of the base to a top side of the telescoping frame, and a fully extended position height extending from the bottom side of the base to the top side of the telescoping frame, wherein the compressed position height is about 90% to about 100% of the fully extended position height.

7. The semiconductor component assembly platform of claim 5, wherein the telescoping frame, the component support, or both the telescoping frame and the component support are movable along, or parallel to, a line that extends generally through the first end of the base frame and the second end of the base frame.

8. The semiconductor component assembly platform of claim 7, wherein the telescoping frame and the component support are movable in a forward and reverse direction along, or parallel to, the line.

9. The semiconductor component assembly platform of claim 1, wherein the telescoping frame is movable along the first guide rail assembly and the component support is movable along the second guide rail assembly.

10. The semiconductor component assembly platform of claim 9, further comprising a linear actuator coupled to the telescoping frame and the component support.

11. The semiconductor component assembly platform of claim 10, further comprising at least one of a cable carrier, drag chain, energy chain, cable chain, or a combination thereof coupled to the linear actuator.

12. The semiconductor component assembly platform of claim 1, wherein the component support comprises a base and an alignment rim, wherein the base is substantially planar, and wherein the alignment rim extends from a top surface of the base.

13. The semiconductor component assembly platform of claim 12, wherein the alignment rim has a shape different than a shape of the base.

14. The semiconductor component assembly platform of claim 12, wherein the alignment rim defines an interior area that is less than an area of the base.

15. The semiconductor component assembly platform of claim 1, wherein, in the compressed position, the first end of the telescoping frame is disposed substantially above the first end of the base frame, and in the fully extended position, the first end of the telescoping frame is disposed between the first end of the base frame and the second end of the base frame, and in the fully extended position, a second end of the component support is disposed horizontally 6 outward of a second end of the telescoping frame relative to the frame body.

16. The semiconductor component assembly platform of claim 1, wherein the base frame, the telescoping frame, the component support, or a combination therefore are formed from a metal, or alloy thereof, having a density of about 3,000 kg/m3 or greater and/or a tensile strength of about 250 MPa or greater.

17. A method of assembling a semiconductor processing chamber comprising:
    placing a processing chamber component on a component support of a component assembly platform in a compressed position, the component assembly platform comprising
        a base frame having a frame body extending from a first end to a second end;
        a telescoping frame movably connected to the base frame, wherein the base frame comprises a first guide rail assembly disposed on a top surface of the base frame, and the telescoping frame comprises a second guide rail assembly disposed on a top surface of the telescoping frame, wherein the second guide rail assembly is disposed above the first guide rail assembly in the compressed position; and
        the component support, wherein the component support is movably connected to the telescoping frame;
    transitioning the component assembly platform from the compressed position to a fully extended position; and
    positioning the processing chamber component within the processing chamber;
    wherein, in the compressed position, the processing chamber component is outside of the processing chamber, and in the fully extended position, a second end of the component support is disposed horizontally outward of the second end of the telescoping frame relative to the frame body and the processing chamber component is located inside of the processing chamber.

18. The method of claim 17, wherein the processing chamber comprises an opening, wherein the processing chamber component is positioned about 0.5 meters or more from the opening.

19. The method of claim 17, wherein the processing chamber component has a weight of about 1 kilogram or more.

* * * * *